United States Patent [19]
Furuta et al.

[11] Patent Number: 6,124,023
[45] Date of Patent: Sep. 26, 2000

[54] PREPREG FOR LAMINATE AND PROCESS FOR PRODUCING PRINTED WIRING-BOARD USING THE SAME

[75] Inventors: Kiyonori Furuta; Tadahiko Yokota, both of Kawasaki, Japan

[73] Assignee: Ajinomoto Co., Inc., Tokyo, Japan

[21] Appl. No.: 08/978,599

[22] Filed: Nov. 26, 1997

[30] Foreign Application Priority Data

Nov. 26, 1996 [JP] Japan .................................... 8-314611
Oct. 22, 1997 [JP] Japan .................................... 9-289563

[51] Int. Cl.$^7$ ...................................................... B32B 3/00
[52] U.S. Cl. ........................... 428/172; 428/196; 428/201; 428/413; 428/537.7
[58] Field of Search ............................... 528/32; 336/200; 428/172, 201, 196, 413, 537.7; 427/306, 307, 98; 216/20, 13, 105; 156/326

[56] References Cited

U.S. PATENT DOCUMENTS

| | | | |
|---|---|---|---|
| 4,323,488 | 4/1982 | Takago et al. | 528/32 |
| 5,107,036 | 4/1992 | Nakajima et al. | 568/727 |
| 5,781,091 | 7/1998 | Krone et al. | 336/200 |

*Primary Examiner*—William Krynski
*Assistant Examiner*—B. Shewareged
*Attorney, Agent, or Firm*—Oblon, Spivak, McClelland, Maier & Neustadt, P.C.

[57] ABSTRACT

The problems are to provide a prepreg for laminate which can secure a heat resistance, electrical insulation properties and an adhesion strength of a conductor layer, a printed wiring-board which satisfies a high density and which is excellent in a heat resistance and electrical insulation properties upon utilizing the conventional production equipment and method of laminate pressing, and a process for producing the same.

A prepreg for laminate characterized in that a paper-like or fabric-like substrate is impregnated with an epoxy resin composition capable of forming a roughened surface through roughening treatment, and a laminate obtained by using the same; a printed wiring-board obtained by using the printed wiring-board and a process for producing the same, which comprises (1) a step of forming a roughened surface by subjecting the surface of the laminate to the roughening treatment, and (2) a step of forming a conductor layer on the roughened surface of the laminate; and a multi-layer printed wiring-board and a process for producing the same, which comprises (1) a step of laminating the prepreg for laminate with an inner layer material such that the prepreg is disposed on the surface, and pressing them to form a laminate, (2) a step of subjecting the surface of the laminate to the roughening treatment to form a roughened surface, and (3) a step of forming a conductor layer on the roughened surface of the laminate.

11 Claims, No Drawings

PREPREG FOR LAMINATE AND PROCESS FOR PRODUCING PRINTED WIRING-BOARD USING THE SAME

BACKGROUND OF THE INVENTION

1. Field of the Invention

The present invention relates to a prepreg for laminate, a laminate prepared from same, and a process for the production of a printed wiring-board using the same.

2. Discussion of the Background

In recent years, printed wiring-boards have been made to have a high density and have been multi-layered, in response to the miniaturization and the high performance demands of electronic devices. In a double-sided board or a multi-layer board having multiple circuitry layers, so-called via holes are usually formed by a perforating step through drilling and copper-plating of hole inner walls to connect circuitry layers. At present, a multilayer printed wiring-board having blind via holes (IVH) has been employed in many cases to satisfy the high density requirements.

In a method in which drilling is employed to form a via hole, it is difficult to form a drilled hole having a small diameter, and the formation of a hole having a small diameter is limited. As a solution thereof, a laser irradiation or perforation with a plasma using an outer layer copper foil of a laminate as a mask has been proposed. However, in a laminate formed by using a conventional glass fabric prepreg, there is a big difference in a heat decomposition temperature between a resin and a glass fiber. Thus, it has been a difficult technique to perforate both components without damaging them. Further, a through-hole plating step is conducted in a copper clad laminate obtained by the conventional laminate-pressing method. Consequently, in the outer layer conductor, the copper thickness of the copper plate is added to the thickness of the copper foil, increasing the thickness of copper. Thus, it is difficult to form a fine pattern.

In order to address this problem, a method in which a copper foil of a copper clad laminate is removed through etching and then a copper plate is applied again to form a conductor layer and a method in which a prepreg and an inner layer material are laminate-pressed, the surface is treated mechanically (physically) and a circuit is formed through copper-plating have been also proposed. In these methods, an adhesion strength between a resin and a copper plate is not satisfactory. Thus, the use of the resulting product as a printed wiring-board has been problematic. Especially, methods using a grinder, a laser beam and the like have been studied as methods of roughening a surface of a laminate physically and mechanically. However, in the former method, a uniformity and a fineness are limited. In the latter method, an accuracy is good, but the production efficiency is poor. Thus, it is not practical.

Japanese Laid-Open (Kokai) No. 295,554/1993 proposes a method in which a prepreg obtained by pulverizing a resin cured upon dispersing a plating catalyst, mixing the resulting powder with a varnish and impregnating the mixture into a substrate is laminated. However, this method involves problems in which properties such as a heat resistance, electrical insulation properties and the like are decreased because the plating catalyst remains and a nitrile rubber is used. Thus, this method can no longer be applied to printed wiring-boards, which in recent years have required a high density.

Meanwhile, a multi-layer printed wiring-board has been developed in which insulating resin layers are built up alternately on a conductor layer without using the conventional laminate-pressing method. However, in this method, it is necessary to introduce a novel equipment, involving a high cost. Further, this method is problematic in respect of reliability with regard to the uniformity of the thickness between insulating resin layers, the adhesion with the inner layer material and incorporation of foreign matters when coating an insulating resin, in comparison with the laminate-pressing method.

Under the above-mentioned circumstances, the problems are to provide a prepreg for laminate and a laminate that satisfy a high density, a heat resistance, electrical insulation properties and an adhesion strength to a conductor layer at the same time, a multi-layer printed wiring-board which meets a high density and which is excellent in a heat resistance and electrical insulation properties upon utilizing the conventional production equipment and method of laminate-pressing, and a process for producing the same.

In order to solve the above-mentioned problems, the present inventors have assiduously conducted investigations, and have consequently found that a prepreg for laminate, a laminate, a printed wiring-board and a multi-layered board obtained by using the same, as described below, exhibit quite excellent properties. These findings have led to the completion of the present invention.

SUMMARY OF THE INVENTION

The present invention provides a prepreg for laminate comprising a paper-like or fabric-like substrate impregnated with an epoxy resin composition capable of forming a roughened surface through a roughening treatment, and a laminate obtained by using the same.

Further, the present invention provides a process for producing a printed wiring-board using the laminate of the present invention, which comprises (1) forming a roughened surface on a laminate by subjecting the surface of said laminate to a roughening treatment; and (2) forming a conductor layer on said roughened surface of said laminate.

Still further, the present invention provides a process for producing a multi-layer printed wiring-board, which comprises:

(1) forming a laminate of a prepreg for laminate with an inner layer material in which a circuit is formed such that said prepreg is disposed on an exposed surface, and pressing said laminate to form a multi-layer laminate;

(2) subjecting said exposed surface of said multi-layer laminate to a roughening treatment to form a roughened surface; and (3) forming a conductor layer on said roughened surface of said multi-layer laminate.

These and other objects of the present invention are made possible by a prepreg for laminate comprising a paper-like or fabric-like substrate impregnated with an epoxy resin composition capable of forming a roughened surface through a roughening treatment.

DETAILED DESCRIPTION OF THE PREFERRED EMBODIMENTS

The prepreg for laminate in the present invention is obtained by impregnating a paper-like or fabric-like substrate with an epoxy resin composition capable of forming a roughened surface on a laminate resulting from the lamination of prepregs for laminate by removing a roughened agent through the roughening treatment. Further, the laminate obtained upon using the same is produced by B-staging the prepregs for laminate, and drying and laminating the same. The laminate referred to in the present invention is one obtained by arranging the prepregs for laminate in the present invention on at least one surface and curing the same, and the number of prepregs used and the structure thereof are not limited. Further, it includes a product obtained by semi-curing or curing only one prepreg for laminate. The known curing methods may be employed. In view of the accuracy of the thickness of the laminate, a laminate-pressing is preferable.

Further, in the laminate of the present invention, the roughened surface is formed on the laminate obtained by curing the prepregs for laminate of the present invention through a chemical roughening treatment of a roughened agent present in the vicinity of the surface of the laminate.

The epoxy resin composition used in the present invention may be a non-uniform curable epoxy resin composition which comprises as formulation (1), (A) an epoxy resin; (B) a latent curing agent which is soluble in the epoxy resin at room temperature; and (C) an epoxy resin curing accelerator as essential components and further optionally (D) a roughened agent which is decomposed or dissolved through the roughening treatment. An epoxy resin composition which a uniform curable epoxy resin composition of formulation (2) comprising (A) an epoxy resin; (B) a latent curing agent which is soluble in the epoxy resin at room temperature; and (D) a roughened agent which is decomposed or dissolved through the roughening treatment, are used in the uniform curable epoxy resin composition. An epoxy resin curing accelerator may optionally be used as necessary.

The respective components in this case are described below.

Specific non-limiting examples of the epoxy resin as component (A) include epoxy resins such as a phenol novolak-type epoxy resin, a cresol novolak-type epoxy resin, a bisphenol A-type epoxy resin, a bisphenol S-type epoxy resin, a bisphenol-type epoxy resin, a bisphenol-type epoxy resin, an N-glycidyl-type epoxy resin and an alicyclic epoxy resin; triglycidyl isocyanurate; and known epoxy resins in view of imparting a flexibility, such as a phenoxy resin, a urethane-modified epoxy resin, a rubber-modified epoxy resin and a brominated epoxy resin.

The latent curing agent as component (B), which is soluble in the epoxy resin at room temperature, is a latent curing agent which is uniformly dissolved in a liquid epoxy resin at room temperature of from 20 to 30° C. Specific non-limiting examples thereof include an amine amide compound obtained from a carboxylate ester, dimethylhydrazine and an epoxy compound as described in *Journal of Applied Polymer Science*, vol. 27, 2361 (1982); and a cyanoacetate ester compound, an adduct of dicyandiamide and an epoxy compound, a reaction product of a dicyandiamide such as o-tolyl biguanide, α-2,5-dimethyl biguanide, diphenyl biguanide, 5-hydroxy-1-biguanide, phenyl biguanide or benzyl biguanide or an aromatic amine, and an N-substituted guanidine compound such as diphenyl guanidine or di-o-tolylguianine as described in *Journal of Polymer Science, Polymer Chemistry Edition*, vol. 23, 2341 (1985). As the latent curing agent which is soluble in the epoxy resin at room temperature as component (B), the guanide derivatives are, among the above-mentioned compounds, especially preferable because the curing conditions can easily be controlled without impairing the properties of the cured product.

Specific non-limiting examples of the epoxy resin curing accelerator as component (C) include tertiary amines, quaternary ammonium salts, imidazole compounds, organic acid salts thereof, phosphine compounds and guanamine compounds. Preferable are the imidazole compounds and the phosphine compounds.

The roughened agent which is decomposed or dissolved through the roughening treatment which can be used as component (D) includes a rubber component and a filler. Non-limiting examples of the rubber component include a polybutadiene rubber (R-45HT made by Idemitsu Petrochemical Co., Ltd., and G-1000 made by Nippon Soda Co., Ltd.), urethane-modified, maleinized, acrylated, methacrylated and epoxy-modified polybutadiene derivatives (R-45EPI made by Idemitsu Petrochemical Co., Ltd, BN-1015 and GQ-1000 made by Nippon Soda Co., Ltd.), core-shell rubber fine particles (Staphiloid made by Takeda Chemical Industries, Ltd., and F351 made by Nippon Zeon Co., Ltd.), and finely divided rubber dispersed epoxy resin (YR-570 and YR-528 made by Tohto Kasei Co., Ltd.).

The amount of the rubber component is preferably 40 parts by weight or less per 100 parts by weight of the epoxy resin. When the amount is larger than the above-mentioned range, the heat resistance and the like are decreased. The cured product of the composition containing this rubber component forms a so-called sea-island structure. The rubber component is decomposed or dissolved through the roughening treatment to form a recessed portion.

As the filler which is decomposed or dissolved through the roughening treatment, an inorganic filler or an organic filler is mentioned. Examples of the inorganic filler include magnesium oxide, zirconium oxide, calcium carbonate, zirconium silicate, calcium hydroxide and aluminum hydroxide. Examples of the organic filler include a melamine resin, a benzoguanamine resin and an epoxy resin powder.

The amount of the filler is preferably 50 parts by weight or less per 100 parts by weight of the epoxy resin. When it is more than the above-mentioned range, the electrical insulation properties and the like are decreased. In the cured product of the epoxy resin composition containing the filler, this filler is decomposed or dissolved through the roughening treatment to form a recessed portion.

The laminate having the roughened surface which is provided by roughening the laminate of the present invention is obtained by impregnating a paper-like or fabric-like substrate with the epoxy resin composition capable of forming the roughened surface through the roughening treatment. The laminate of the present invention has such a property that the roughened surface is formed by roughening the surface of the laminate obtained by semi-curing or curing the prepreg for laminate. A means for forming the roughened surface is not particularly limited so long as it is a chemical method.

Specific examples of the roughening agent which can be used in the roughening treatment include oxidizing agents such as a bichromate, a permanganate, ozone, hydrogen peroxide/sulfuric acid and nitric acid; organic solvents such as N-methyl-2-pyrrolidone, N,N-dimethylformamide and methoxypropanol; alkaline aqueous solutions such as sodium hydroxide and potassium hydroxide; and acid aqueous solutions such as sulfuric acid and hydrochloric acid. Various plasma treatments are also available. These treatments may be used alone or in combination.

With respect to the roughness of the roughened surface of the resulting laminate having the roughened surface, $R_{max}$ is at least 0.5 μm and at most 15 μm, preferably at least 2 μm and at most 10 μm. When it is less than the above-mentioned range, a low anchor effect is provided, decreasing the peeling strength of the plated copper foil. When it is more than the above-mentioned range, it is difficult to form a fine circuit.

When only a physical polishing such as buff polishing, jet scrubbing or the like is employed, the above-mentioned anchor effect is not obtained, decreasing the peeling strength of the plated copper foil. After a physical roughening is completed, the roughening treatment with a chemical roughening agent may be carried out.

The non-uniform curable epoxy resin composition constituting the prepreg for laminate in the present invention contains as essential components (A) an epoxy resin; (B) a latent curing agent which is soluble in the epoxy resin at room temperature; and (C) an epoxy resin curing accelerator. The composition ratio of these components of this epoxy resin composition is described below.

With respect to the ratio of (A) the epoxy resin and (B) the latent curing agent which is soluble in the epoxy resin at room temperature, (B) the latent curing agent is between 1 and 30 parts by weight, preferably between 1 and 20 parts by weight per 100 parts by weight of (A) the epoxy resin. When (B) the latent curing agent is less than the above-mentioned range, the resulting product is uncured. When it is more than the above-mentioned range, the curing conditions cannot be controlled, and the electrical insulation properties and the like of the cured product are decreased.

With respect to the ratio of (A) the epoxy resin and (C) the epoxy resin curing accelerator, (C) the epoxy resin curing accelerator is at most 10 parts by weight, preferably at most 5 parts by weight per 100 parts by weight of (A) the epoxy resin. When (C) the epoxy resin curing accelerator is more than the above-mentioned range, the curing cannot be controlled, and the properties of the cured product are decreased.

When the epoxy resin composition used in the present invention comprises, as formulation (2), a uniform curable epoxy resin composition and a roughened agent which is decomposed or dissolved through the roughening treatment, the above-mentioned epoxy resin, the epoxy resin curing agent and as required, the epoxy resin curing accelerator are used in the uniform curable epoxy resin composition. The composition ratio varies depending on the types of the epoxy resin and the epoxy resin curing agent used. It is within such a range that the unreacted epoxy resin and epoxy resin curing agent do not remain after the completion of the curing. The epoxy resin curing accelerator can be used in such a range as the properties of the cured product do not decrease.

The components of the epoxy resin composition may be mixed by conventional methods known to those of ordinary skill in the art, any may further comprise an inert solvent, such a methyl ethyl ketone, acetone, and ethyl acetate.

The production of the printed wiring-board in the present invention is characterized by using a prepreg for laminate obtained by impregnating a paper-like or fabric-like substrate with an epoxy resin composition containing, as formulation (1), (A) an epoxy resin; (B) a latent curing agent which is soluble in the epoxy resin at room temperature; and (C) an epoxy resin curing accelerator as essential components. That is, since the epoxy resin composition used in the prepreg contains the latent curing agent which has a low reactivity and which is soluble in the epoxy resin at room temperature, the cured state of the prepreg can easily be controlled by changing the press-curing conditions, making it possible to form a roughened surface required for securing the peeling strength of the conductor layer. Further, after the conductor is formed through electroless plating or electrolytic plating, the heat treatment (including plate-annealing) is conducted at a temperature higher than a glass transition temperature of an epoxy resin composition, thereby curing the remaining unreacted epoxy resin and further increasing the peeling strength of the conductor layer.

Non-limiting examples of a paper-like or fabric-like substrate used in the present invention may include paper, a woven or non-woven fabric formed of inorganic fibers such as glass fibers and carbon fibers, and a woven or non-woven fabric formed of organic fibers such as polyester fibers and aramid fibers. However, from the standpoint of the processability by laser irradiation, the use of the organic fibers is especially preferable. It is also preferable in view of the light weight of the printed wiring-board.

In regard to the process for producing the printed wiring board using the laminate in the present invention, the prepreg may be provided on at least one surface in the production of the prepreg for laminate or the laminate in the present invention. The number of prepregs to be laminated and the structure thereof are not particulary limited. The present invention includes also the product obtained by curing only one prepreg for laminate. Further, the known curing method can be employed. However, in view of the accuracy of the thickness of the board, a laminate-pressing is preferable. At this time, the conditions for the laminate pressing are determined to control the structure of the prepreg layers and the cured state. It is preferable that the temperature is between 120 and 170° C., the time is between 15 and 90 minutes, and the pressure is between 20 and 60 kgf/m². When the temperature is lower than the above-mentioned range and the time is shorter than the above-mentioned range, the curing is unsatisfactory, and it incurs problems with respect to the drilling property of the through-hole and flaws on the surface. Meanwhile, when the temperature is higher than the above-mentioned range and the time is longer than the abovementioned range, the roughened surface can hardly be formed. After the drilling of the penetration through-hole is conducted as required, the surface of the above-mentioned laminate is treated with the roughening agent to form the roughened surface.

Further, a conductor layer may be formed on the roughened surface of the laminate by conducting panel plating through a combination of electroless plating and electrolytic plating and employing a subtractive method using a dry film resist. The formation of a conductor layer may be accomplished by conventional methods known to those of ordinary skill in the art. At this time, it is also possible that a resist layer having an opposite pattern to that of the conductor layer is formed on the roughened surface of the laminate and the conductor layer is formed through electroless plating alone. Further, the conductor layer may be formed through deposition or sputtering. In this manner, after the conductor layer is formed, the annealing treatment is conducted at a temperature higher than the glass transition temperature of the epoxy resin composition, whereby the remaining unreacted epoxy resin is cured to be able to further increase the peeling strength of the conductor layer.

In the process for producing the multi-layer printed wiring board using the circuit-formed inner layer material and the prepreg through a laminate-pressing, the multi-layer laminate of the inner layer material and the prepreg is formed such that the prepreg for laminate in the present invention is disposed on an exposed surface. At this time, the laminate-pressing conditions are determined by the inner layer material and the prepreg used and the layer structure of the desired multi-layer printed wiring board. In order to control the cured state of the prepreg, it is advisable that the temperature is between 120 and 170° C., and the time is between 15 and 90 minutes. The pressure is determined depending on the embedding property between patterns of the inner layer material. When the temperature is lower than the above-mentioned range and the time is shorter than the abovementioned range, the curing of the resin is unsatisfactory, and there are problems in regard to the drilling property of the through-hole and the flaw of the surface. On the contrary, when the temperature is higher than the above-mentioned range and the time is longer than the above-mentioned range, the roughened surface can hardly be formed. Subsequently, after the drilling of the penetration through-hole and the formation of the blind through-hole through the laser irradiation are conducted as required, the surface of the laminate may be treated with a roughening agent to form a roughened surface.

Further, a conductor layer may be formed on the roughened surface of the laminate by conducting panel plating through a combination of electroless plating and electrolytic plating and employing a subtractive method using a dry film resist. At this time, it is also possible that a resist layer having an opposite pattern to that of the conductor layer is formed on the roughened surface of the laminate and the conductor layer is formed through electroless plating alone. Further, the conductor layer may be formed through deposition or sputtering. In this manner, after the conductor layer is formed, the annealing treatment is conducted at a temperature higher than the glass transition temperature of the epoxy resin composition, whereby the remaining unreacted epoxy resin is cured to be able to further increase the peeling strength of the conductor layer.

Having generally described this invention, a further understanding can be obtained by reference to certain specific examples which are provided herein for purposes of illustration only and are not intended to be limiting unless otherwise specified.

EXAMPLES 1 TO 5

An epoxy resin composition was prepared according to the formulation (value: parts by weight) shown in Examples of Table 1, and a prepreg for laminate was formed therefrom. In the production of the epoxy resin composition in Examples, a resin, an epoxy curing agent and an epoxy resin curing accelerator were uniformly mixed in a methyl ethyl ketone solvent, and a glass fiber fabric or an aramid fiber fabric (Technola made by Teijin Ltd.) were impregnated with the mixture. The resulting fabric was dried at 70° C. for 20 minutes to obtain a prepreg for laminate. The thus-obtained prepregs for laminate were laminated on upper and lower surfaces of a circuit-formed inner layer material, and the laminate was pressed under conditions of 150° C. and 45 minutes. Thereafter, blind through-holes were formed by the carbon dioxide gas laser processing. The roughening treatment was conducted using a roughening agent to obtain a laminate having a roughened surface. The laminate was swollen with a mixture of an alkaline aqueous solution and a solvent, and treated with an alkaline permanganate aqueous solution and then with a reducing agent. Electroless copper plating and electrolytic copper plating were conducted to form a copper clad laminate having a copper thickness of 35 microns. The annealing treatment was conducted at 150° C. for 60 minutes, and the circuit formation was then conducted by a usual subtractive method to produce a multi-layer printed wiring-board. This board was evaluated.

EXAMPLES 6 TO 8

Epoxy resin compositions were produced according to the formulation (value: parts by weight) shown in Examples 1, 2 and 3 of Table 1 to form prepregs for laminate each having a thickness of 0.1 mm. Six prepregs for laminate were laminated, and treated under pressing conditions of 160° C., 60 minutes and 40 kgf/m² to prepare a laminate. Thereafter, penetration through-holes were formed using a drill, and a roughened surface was formed on the laminate using a roughening agent to obtain a laminate having a roughened surface. The laminate was swollen with a mixture of an alkaline aqueous solution and a solvent, and treated with an alkaline permanganate aqueous solution and then with a reducing agent. A copper clad laminate having a copper thickness of 35 microns was produced through electroless copper plating and electrolytic copper plating. The annealing treatment was conducted at 150° C. for 60 minutes, and the circuit formation was then carried out by the usual subtractive method to form a double-sided printed wiring-board. This board was evaluated.

EXAMPLE 9

An epoxy resin composition was prepared according to the formulation (value: parts by weight) shown in Example 1 of Table 1, and a prepreg for laminate having a thickness of 0.1 mm was formed therefrom. Six prepregs R-1661 (0.1 mm thick) made by Matsushita Electric Works, Ltd. were used, and two prepregs for laminate were mounted on both surfaces thereof. These were treated under pressing conditions of 160° C., 60 minutes and 40 kg f/m² to prepare a laminate. Thereafter, penetration throughholes were formed using a drill, and a roughened surface was formed on the laminate using a roughening agent to obtain a laminate having a roughened surface. The laminate was swollen with a mixture of an alkaline aqueous solution and a solvent, and treated with an alkaline permanganate aqueous solution and then with a reducing agent. A copper clad laminate having a copper thickness of 35 microns, was produced through electroless copper plating and electrolytic copper plating. The annealing treatment was conducted at 150° C. for 60 minutes, and the circuit formation was then carried out by the usual subtractive method to form a double-sided printed wiring-board. This board was evaluated.

Comparative Example 1

An epoxy resin composition was prepared according to the formulation (value: parts by weight) shown in Comparative Example of Table 1 to form a prepreg for laminate. The production of epoxy resin compositions and the evaluation samples in Comparative Examples corresponded to those in Example 1.

Comparative Example 2

The epoxy resin composition shown in Example 1 of Table 1 was physically roughened using a jet scrub (Sakurandam #230). The evaluation was conducted as in Example 1.

Comparative Example 3

An epoxy resin composition was prepared according to the composition (value: parts by weight) shown in Comparative Example 1 of Table 1 to form a prepreg for laminate. Six prepregs for laminate were laminated, and treated under pressing conditions of 160° C., 60 minutes and 40 kgf/m². Then, penetration throughholes were formed through drilling, and the roughening treatment was conducted using a roughening agent. The resulting product was swollen with a mixture of an alkaline aqueous solution and a solvent, and treated with an alkaline manganate aqueous solution and then with a reducing agent. A copper clad laminate having a copper thickness of 35 microns was formed through electroless copper plating and electrolytic copper plating. The annealing treatment was conducted at 150° C. for 60 minutes, and the circuit formation was then conducted by the usual subtractive method to form a double-sided printed wiring-board. This board was evaluated.

annealing, and no problem of swelling or the like was found in the test of the heat resistance through soldering. Further,

TABLE 1

| Formulation | Example 1 | Example 2 | Example 3 | Example 4 | Example 5 | Comparative Example 1 |
|---|---|---|---|---|---|---|
| EP1001 | 80 | 60 | 70 | 80 | 70 | 80 |
| EP828 | 20 | 10 | 10 | 20 | 10 | 10 |
| N-673 |  |  | 20 |  | 20 | 10 |
| YR-450 |  | 20 |  |  |  |  |
| R-45HT |  |  |  | 25 |  |  |
| calcium carbonate |  |  |  |  | 15 |  |
| Curing agent A | 8 |  |  |  |  |  |
| Curing agent B |  | 10 |  |  |  |  |
| Curing agent C |  |  | 8 |  |  |  |
| Curing agent D |  |  |  | 4 | 4 | 5 |
| Curing accelerator | 3 | 2 | 1 | 2 | 2 | 3 |
| Substrate | glass fiber fabric | aramid fiber fabric | glass fiber fabric | glass fiber fabric | aramid fiber fabric | glass fiber fabric |

Remarks:
EP1001: bisphenol A-type epoxy resin made by Yuka Shell K. K.
EP828: bisphenol A-type epoxy resin made by Yuka Shell K. K.
N-673: phenol novolak-type epoxy resin made by Dai Nippon Ink and Chemicals, Incorporated
YR-450: rubber-modified epoxy resin made by Tohto Kasei Co., Ltd.
R-45HT: hydroxyl group-capped polybutadiene made by Idemitsu Petrochemical Co., Ltd.
Curing agent A: N,N-dimethyl-N-(2-hydroxy-3-allyloxypropyl)amine-N'-lactoimide
Curing agent B: ethyl cyanoacetate
Curing agent C: o-tolyl biguanide
Curing agent D: dicyandiamide
Curing accelerator: 2E4MZ made by Shikoku Chemical Co., Ltd.

The results are shown in Tables 2 and 3. As is clear from Examples, when using the prepreg for laminate obtained by impregnating the paper-like or fabric-like substrate with the epoxy resin composition capable of forming the roughened surface through the roughening treatment, the excellent peeling strength was obtained without the swelling after the annealing, and no problem of swelling or the like was found in the test of the heat resistance through soldering. Further, with respect to the laser processability, Examples 2 and 5 using the aramid fiber fabric, the organic substrate, provided the good results. Meanwhile, in Comparative Examples, the swelling after the annealing and the swelling in the test of the heat treatment through soldering occurred, and the peeling strength was also unsatisfactory.

TABLE 2

| Test items | Example 1 | Example 2 | Example 3 | Example 4 | Example 5 | Comparative Example 1 | Comparative Example 2 |
|---|---|---|---|---|---|---|---|
| Laser processability | x | ○ | x | x | o | x | x |
| Roughness | 3 | 3.7 | 2.8 | 4 | 5 | 1.5 | 2.5 |
| Swelling after annealing | No | No | No | No | No | Yes | Yes |
| Peeling strength | 1.3 | 1.4 | 1.2 | 1.1 | 1 | unmeasurable | 0.3 |
| Heat resistance through soldering | ○ | ○ | ○ | ○ | ○ | x | x |

Remarks:
Laser processability: using a carbon dioxide gas laser irradiation device supplied by Sumitomo Shipbuilding & Machinery Co., Ltd.
○ = good
x = protrusion of a substrate
Roughness: Roughness after the roughening treatment ($\mu$m)
Swelling after annealing: annealing conditions = at 150° C. for 60 minutes
Peeling strength: according to JIS-C-6481 (kfg/cm)
Heat resistance through soldering: at 260° C. for 30 seconds
○ = good
x = Swelling occurs.

TABLE 3

| Test items | Example 6 | Example 7 | Example 8 | Example 9 | Comparative Example 3 |
|---|---|---|---|---|---|
| Roughness | 4.5 | 5.5 | 3.6 | 3.5 | 2.1 |
| Swelling after annealing | No | No | No | No | Yes |
| Peeling strength | 1.3 | 1.4 | 1.2 | 1.3 | unmeasurable |
| Heat resistance through soldering | ◯ | ◯ | ◯ | ◯ | x |

Remarks:
Roughness: Roughness after the roughening treatment (μm)
Swelling after annealing: annealing conditions = at 150° C. for 60 minutes
Peeling strength: according to JIS-C-6481 (kfg/cm)
Heat resistance through soldering: at 260° C. for 30 seconds
◯ = good
x = Swelling occurs.

Comparative Example 4

A laminate was produced as in Example 2, and an attempt was made to form a conductor on the surface of the laminate without forming a roughened surface through the roughening treatment with a roughening agent. However, no desired conductor layer was formed on the surface of the substrate.

A prepreg for laminate or a laminate in the present invention satisfies the electrical characteristics as a multi-layer printed wiring-board and can, therefore, be put to practical use. It is characterized in that a roughened surface required to secure the peeling strength of a conductor layer can be formed through the roughening treatment. Further, when organic fibers are used in a paper-like or fabric-like substrate to improve a laser processability, making it easy to form a blind through-hole which was hardly formed in a multi-layer printed wiring-board by the conventional laminate-pressing method. Still further, since an insulating resin layer is formed of an epoxy resin, a multi-layered printed wiring-board which is highly reliable because of excellent heat resistance and electrical insulation properties can be produced. Furthermore, the laminate of the present invention can provide a fine pattern which could hardly be provided in the conventional method of producing a printed wiring-board using a copper clad laminate owing to the great copper thickness of the outer layer.

Obviously, numerous modifications and variations of the present invention are possible in light of the above teachings. It is therefore to be understood that within the scope of the appended claims, the invention may be practiced otherwise than as specifically described herein.

This application is based on Japanese patent applications JP 314611/1996 and JP 289563/1997 filed in the Japanese Patent Office on Nov. 26, 1996 and Oct. 22, 1997 respectively, the entire contents of each are hereby incorporated by reference.

What is claimed as new and desired to be secured by Letters Patent of the United States is:

1. A prepreg for the formation of a laminate, comprising:
    a paper or fabric substrate impregnated with an epoxy resin composition containing a roughening component which is a rubber material, filler or combination thereof, at least one surface of the impregnated paper or fabric having been roughened by directly contacting the surface(s) of said prepreg with a chemical roughening agent or with a plasma.

2. The prepreg of claim 1, wherein said epoxy resin composition comprises:
    (1) a non-uniform curable epoxy resin composition comprising (a) an epoxy resin, (b) a latent curing agent which is soluble in the epoxy resin at room temperature, (c) an epoxy resin curing accelerator as essential components and (d) said roughening component; or
    (2) a uniform curable epoxy resin composition comprising (a) an epoxy resin, (b) a latent curing agent which is soluble in the epoxy resin at room temperature and (c) said roughening component.

3. The prepreg for laminate of claim 1, wherein said paper or fabric substrate is formed of organic fibers.

4. The prepreg for laminate of claim 2, wherein said latent curing agent (B) which is soluble in the epoxy resin at room temperature is a guanidine derivative.

5. A laminate obtained by laminate-pressing a prepreg, said prepreg comprising a paper or fabric substrate impregnated with an epoxy resin composition containing a roughening component which is a rubber material, filler or combination thereof, at least one surface of the impregnated paper or fabric having been roughened by directly contacting the surface(s) of said prepreg with a chemical roughening agent or with a plasma.

6. The laminate of claim 5, wherein said epoxy resin composition is:
    (1) a non-uniform curable epoxy resin composition comprising (a) an epoxy resin, (b) a latent curing agent which is soluble in the epoxy resin at room temperature, (c) an epoxy resin curing accelerator and (d) said roughening component; or
    (2) a uniform curable epoxy resin composition comprising (a) an epoxy resin, (b) a latent curing agent which is soluble in the epoxy resin at room temperature and (c) said roughening component.

7. The laminate of claim 5, wherein said paper or fabric substrate is formed of organic fibers.

8. The laminate of claim 6, wherein said latent curing agent (B) which is soluble in the epoxy resin at room temperature is a guanidine derivative.

9. A laminate having a roughened surface, said roughened surface formed by:
    directly contacting at least one surface of a laminate prepared by laminate-pressing a prepreg comprising a paper or fabric substrate impregnated with an epoxy resin composition containing a roughening component which is a rubber material, filler or combination thereof with a chemical roughening agent or with a plasma.

10. The laminate of claim 9, further comprising a via hole.

11. The laminate of claim 9, wherein said via hole is formed by laser irradiation.

* * * * *